United States Patent [19]
Pasco

[11] Patent Number: 5,846,442
[45] Date of Patent: Dec. 8, 1998

[54] CONTROLLED DIFFUSION PARTIAL ETCHING

[75] Inventor: Jeffrey R. Pasco, Hutchinson, Minn.

[73] Assignee: Hutchinson Technology Incorporated, Hutchinson, Minn.

[21] Appl. No.: 397,836

[22] Filed: Mar. 2, 1995

[51] Int. Cl.$^6$ ........................................................ B44C 1/22
[52] U.S. Cl. ................................................. 216/41; 216/66
[58] Field of Search ......................... 216/47, 41; 438/942

[56] References Cited

U.S. PATENT DOCUMENTS

| | | | |
|---|---|---|---|
| 2,854,336 | 9/1958 | Gurknecht | 216/47 |
| 3,931,641 | 1/1976 | Watrous | 360/104 |
| 4,167,765 | 9/1979 | Watrous | 360/103 |
| 4,235,664 | 11/1980 | Menke | 156/645 |
| 4,251,318 | 2/1981 | Oberg et al. | 156/645 |
| 5,157,003 | 10/1992 | Tsuji et al. | 437/229 |
| 5,275,695 | 1/1994 | Chang et al. | 216/47 |
| 5,428,490 | 6/1995 | Hagen | 360/104 |

*Primary Examiner*—John Goodrow
*Attorney, Agent, or Firm*—Faegre & Benson LLP

[57] ABSTRACT

A single stage expose/etch partial etching process fabricates at least two areas of differing remaining thicknesses in a substrate. The process comprises (a) applying a resist mask to the substrate; (b) patterning the mask in a first area with a plurality of first mask openings and first mask land features having land feature widths and spacings selected such that the first area is a critical etch space having a reduced etch factor; (c) patterning the mask in a second area having at least one second mask opening, such that the average distance between edges of the second mask opening is greater than the average critical etch space.

The critical etch space is the distance between edges of a resist mask opening below which the etch factor for that distance begins to decrease.

When the substrate is isotropically etched through the first and second areas of the mask for a set period of time, the etch removal rate for the first area is less than the etch removal rate for the second area.

23 Claims, 7 Drawing Sheets

CONTROLLED DIFFUSION PARTIAL ETCHING

FIELD OF THE INVENTION

This invention relates to a single stage expose-and-etch partial etching process for fabricating a structure characterized by having at least two etched areas which have substantially differing remaining average thicknesses. More particularly, this invention describes a method of determining an etch space for mask openings in a first mask area having a plurality of mask openings and mask land features, dimensioned so that an etch removal rate for that first mask area is less than an etch removal rate for a mask opening in a second mask area, which has an etch space for mask openings greater than that of the first area. In addition, according to the present process, the width and the separation of land features in the first mask area are dimensioned so that, as the etching proceeds, undercuts from both sides of each land feature meet, thus allowing the mask to be separated from the substrate.

BACKGROUND OF THE INVENTION

Partial depth etching is based on the principles of isotropic etching and the fluid dynamics of etching. Isotropic etching is defined as etching which occurs equally in all directions. As etching of an exposed substrate surface begins, a side wall develops at the edge of the resist mask. Once the formation of the side wall begins, nothing exists to prevent the etching away of the side wall underneath the resist mask, otherwise known as "undercutting".

The depth of etch divided by the amount of undercut is known as the "etch factor" and describes the shape of the etched recess at a given point in the etch time. Key factors influencing the etch factor include such variables as time of etch, spacing distance (width of exposed substrate) between edges of resist mask openings, orientation between resist mask openings and resist mask land features, etchant chemistry and method of etchant application.

One of the key variables in etching is the influence of the spacing distances between edges of the resist mask openings. Theoretical and experimental studies have shown a strong dependence of the rate of the depth of etch versus the original space width between resist mask edges. Fluid modeling suggests that as the depth of the etched depression increases to form a cavity, the flow of etchant within the cavity causes one or more flow eddies to be formed. This phenomenon causes a reduction in the downward etch rate, because reactant by-products must traverse these eddies to escape the cavity. This influence decreases as the etched cavity deepens and eventually the etch factor approaches a constant.

Previous studies have also shown that the minimum width of etch openings in a photoresist that can be produced is severely restricted by the widths of the etch openings and the widths of the land features in the photoresist. This is so because, as the widths of the etch openings and the land features are diminished, the width of the undercut will begin to exceed half of the width of the smallest land features and undercutting from both sides will cause the resist to become detached from the substrate. These factors are discussed in greater detail in *Quantitative Examination of Photofabricated Profiles; Part 2—Photoetched Profiles in Stainless Steel* by Allen, et al., *The Journal of Photographic Science*, Vol. 26, 1978, pages 72–76.

However, the rate of undercutting which occurs at the substrate-resist interface is not retarded as the etch cavity deepens, because the interface is nearer to the main etchant flow path. Therefore, as etching progresses, the etch factor decreases rapidly with increasing depth of etch and ultimately approaches a constant value for given space width between edges of resist mask openings.

As mentioned above, the etch factor is strongly dependent on the original width between edges of resist mask openings. The etch factor is greatest for the widest spacing between edges of resist mask openings and is least for the narrowest spacing. Again, this is true because the etch rate downward is most retarded in small geometries, i.e., narrower spaces between edges of resist mask openings, such as narrow grooves, slots, and small holes. In such small geometries, spent etchant cannot be easily replenished.

For a particular etchant chemistry and etchant transport method, there exists a critical spacing dimension, referred to as "critical etch space." When the spacing widths between edges of resist mask openings are reduced to less than the "critical etch space", the downward rate of etching decreases. When the spacing widths between edges of resist mask openings are greater than the "critical etch space", the downward rate of etching remains essentially constant.

The same principles are in effect at feature breakthrough (i.e., total etchant breakthrough of the substrate at the mask opening) and at initiation of the feature aperture (i.e., beginning of etchant reduction of substrate thickness). At the onset of the aperture formation, the etch factor increases as the exchange rate of reactants and by-products is accelerated. The etch factor quickly approaches a constant relative to the etchant chemistry, feature geometry and orientation, and the method of etchant application. To obtain the desired etched feature size and etched sidewall profile, the photoresist mask features must have their dimensions altered to compensate by an appropriate amount, thereby to allow for etch undercutting that occurs prior to and after breakthrough.

The development of the technological background for the controlled diffusion partial etch process of the present invention is traceable to photoetching fabrication processes developed for other products manufactured by Hutchinson Technology Incorporated, the assignee of the present application. For example, the narrow partial etch land features according to the present invention have similarities to characters photoetched onto a print wheel, such as a type-carrier element, used in high speed printers. Reference is made to U.S. Pat. No. 4,235,664 and to U.S. Pat. No. 4,251,318, both assigned to Hutchinson Technology Incorporated for their disclosures of processes for etching type-carrier elements. According to the photoetching procedures as described in these two patents, full thickness print characters are carved out of substrate material by partial etching of the substrate material surrounding the desired print characters. The final step in this prior known process was a separate step to partial etch the full-thickness characters. This final step was achieved by stripping off the resist, followed by a separate round-off etch pass of the unmasked full-thickness characters to break the sharp edges of each character. Not only were the characters partially etched but the entire print wheel was again partially etched at the same time.

BRIEF DESCRIPTION OF THE INVENTION

A single stage expose/etch partial etching process fabricates at least two areas of substantially differing remaining thicknesses in a substrate. The process comprises these steps:

A resist mask is applied to selected portions of the substrate.

The mask is patterned in a first mask area over a first portion of said substrate to provide an etch pattern establishing a critical etch space for etching said first area to a first average depth where said first mask area is of predetermined planar size and shape and said mask is comprised of a plurality of alternating first mask land features each of which has a maximum width which is less than the first average depth and a plurality of first mask openings interposed between such first mask land features, said first average depth being determined for a predetermined etching time by the width of the first mask land features and the width of the first mask openings which are selected to have dimensions so that the first mask area is a critical etch space wherein a critical etch space is defined as an area where the width of the exposed substrate between mask edges is selected so that the etch factor is reduced over the etch factor otherwise applicable to the substrate.

The mask is patterned in a second mask area on a second portion of said substrate, where said second mask area has at least one opening of predetermined size and shape.

The entire substrate is isotropically etched for a predetermined time with the critical etch space of said first mask area etched to a lesser depth than the depth of the second mask area due to the reduced etch factor of the first mask area.

DETAILED DESCRIPTION OF THE INVENTION

According to the process of the present invention it is possible, through a combination of varying distances between edges of resist mask openings and varying the width of resist mask land features thereby to achieve in a single etching operation an etched product having more than one partial etch thickness where there is a measurable difference in the partial etch thickness. In accordance with the present invention the dimensions of the resist mask openings and the widths of the resist mask land features are sized in accordance with this invention according to the desired partial etch depth and the desired characteristic etch factor. Varying the widths of the land features and the widths of the openings in the resist mask provides the required adjustment for obtaining the optimal etch depth for a given feature size. As discussed in greater detail below, using appropriate variable combinations of these dimensions enables more than one partial etch remaining average thickness area to be obtained with a single stage expose/etch partial etch processing.

Figure 1A:
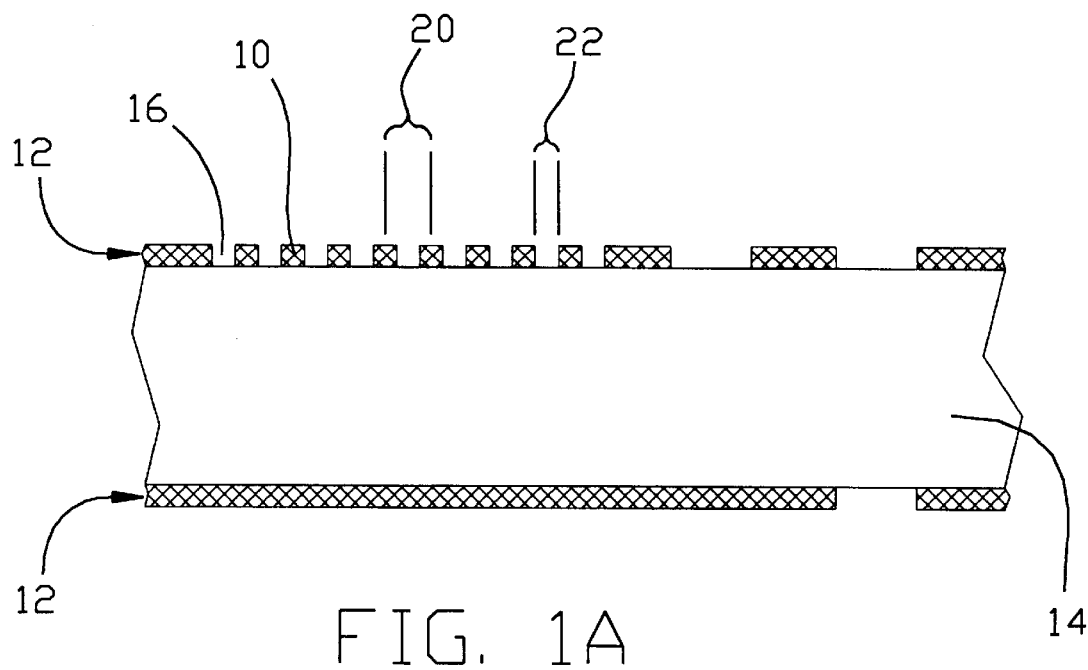
FIG. 1A illustrates a substrate patterned with a resist having resist areas dimensioned for controlled diffusion partial etching according to this invention, for conventional partial etching and for conventional etching of a thru-feature.
Figure 1B:
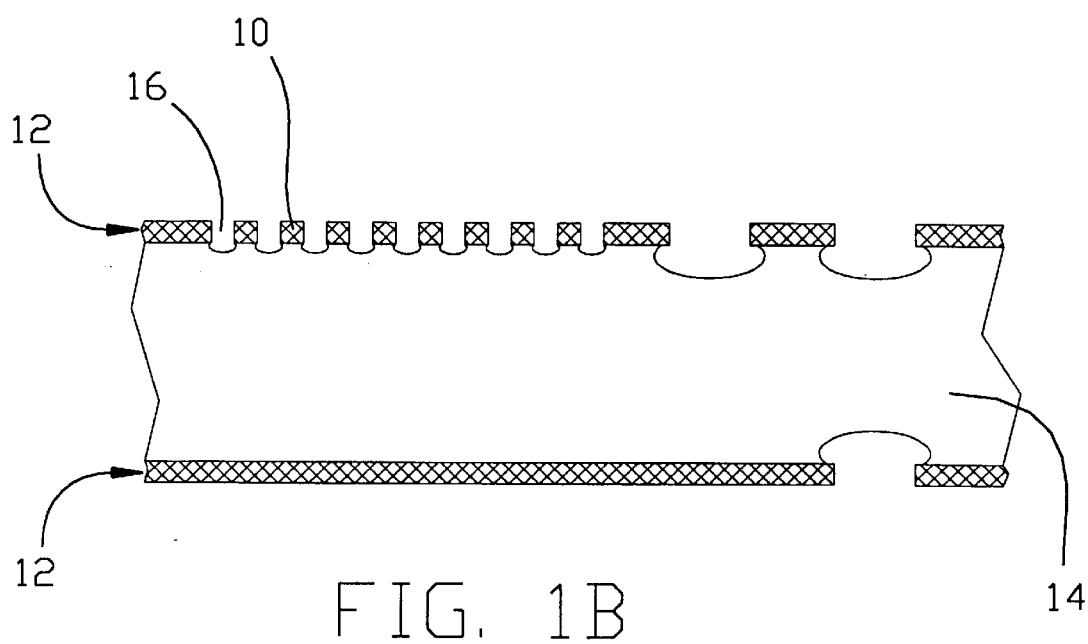
FIG. 1B illustrates a substrate according to FIG. 1A after initiation of etching.
Figure 1C:
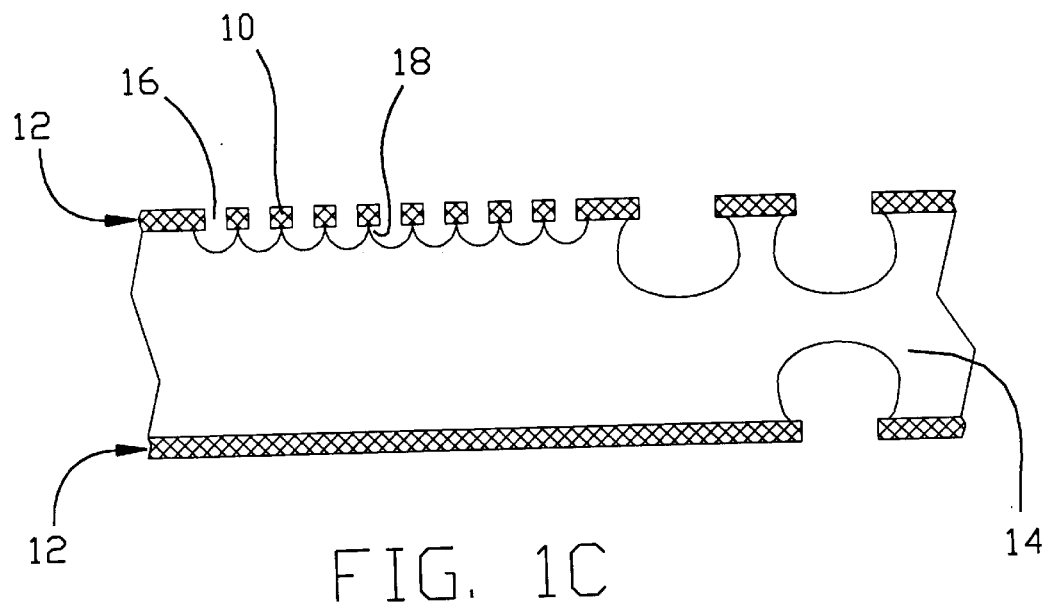
FIG. 1C illustrates a substrate according to FIG. 1A after resist has been separated from the substrate in the region of controlled diffusion partial etching.
Figure 1D:
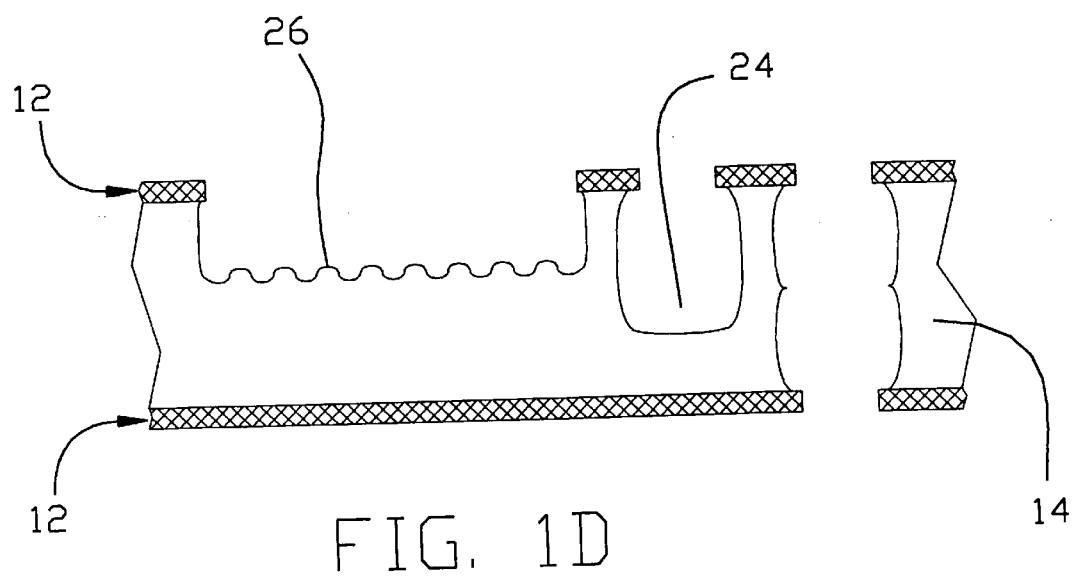
FIG. 1D illustrates a substrate according to FIG. 1A after breakthrough of the thru-feature.

The success of the present novel technique is founded on recognizing and utilizing the interrelationship of the relative dimensions of the two fundamental physical characteristics of the resist mask, the width of the land features and the width of the openings between land features. Reference is made to FIGS. 1A–1D to illustrate the present novel etching technique. First, according to the present controlled diffusion partial etching, the land features 10 in the resist mask 12 are dimensioned so that, as etching proceeds, undercut regions formed from each side of the land features 10 meet each other, thus causing the land features 10 to lose adhesion to the substrate 14 and separate from the substrate being etched; FIGS. 1A, 1B and 1C. That is, the land features 10 and the openings 16 in the resist mask 12 are dimensioned so that, as the etching proceeds, the width of the undercut 18 soon meets and then exceeds half of the width of the land features 10; FIG. 1C. When the land features 10 of the resist mask 12 are thus undercut from both sides, the land features 10 become detached from the substrate 14; FIG. 1C. Thus, the land feature 10 is eventually completely separated from the substrate 14, allowing the substrate 14 in that area to be further etched in thickness and in shape; FIG. 1D without any further mask effects. The shape of the resist land features may be in any shape or configuration, but the shapes are generally either replicated lines or pedestals. The remains of the land features will generally mimic the resist land features, but in some cases it may be difficult to detect any pattern.

Additionally, in accordance with the present invention, the width of the land features are selected to be less than the depth of the etch. The land features are spaced on centers 20 such that distance between resist mask edges 22 is less than the "critical etch space". The etch factor decreases as the spacing distance is reduced below the critical etch space.

Consequently, the etch removal rate in the region of controlled diffusion partial etching is less than in other areas having conventionally dimensioned resist mask patterns of openings and land features, that is, for other areas having an etch space greater than this "critical etch space."

As seen in FIG. 1D, the multiple combinations of land feature widths and distances between edges of openings 22 dimensioned according to the present invention produce resultant average thicknesses in the partial etch areas that, for a given etch time, are thicker than for conventional partial etch areas 24 which result from the use of substantially wider distances between edges of the resist mask openings. Thus, the remaining thickness of the area etched according to the present invention is actually an average of the cross-sectional thickness at various points across a particular partial etch area, since this technique typically leaves a geometrically determined non-flat floor 26 which may have a smoothly oscillating arcuate, line land feature having a generally sine wave, profile, as illustrated in FIG.

1D. The remaining thickness of the etched surface could also be thought of in terms of the "effective" thickness of a variable thickness area.

The controlled diffusion partial etching process of the present invention can be used to provide two or more areas of differing partial etch residual or remaining thicknesses following a single-step partial etch procedure. The present process is particularly suitable to providing two or more separate partial etch thickness zones on a substrate having a uniform initial thickness.

For example, the present process can be used to fabricate two or more partial etch features having substantially different remaining etch thicknesses on a gimballing flexure for a head suspension assembly. Head suspension assemblies are used in rigid disk information storage devices for supporting magnetic read/write transducers flying in close proximity to a rotating disk in order to access information on the disk surface. The HSAs referred to are generally of the type known as a Watrous suspension system, such as described in U.S. Pat. Nos. 3,931,641 and 4,167,765. Reference is made to these two patents for a more detailed discussion of the structure and use of Watrous type head suspension systems.

The controlled diffusion partial etching process of the present invention can also be used in other manufacturing procedures requiring the formation of areas of differing remaining partial etch thickness.

Figure 2:
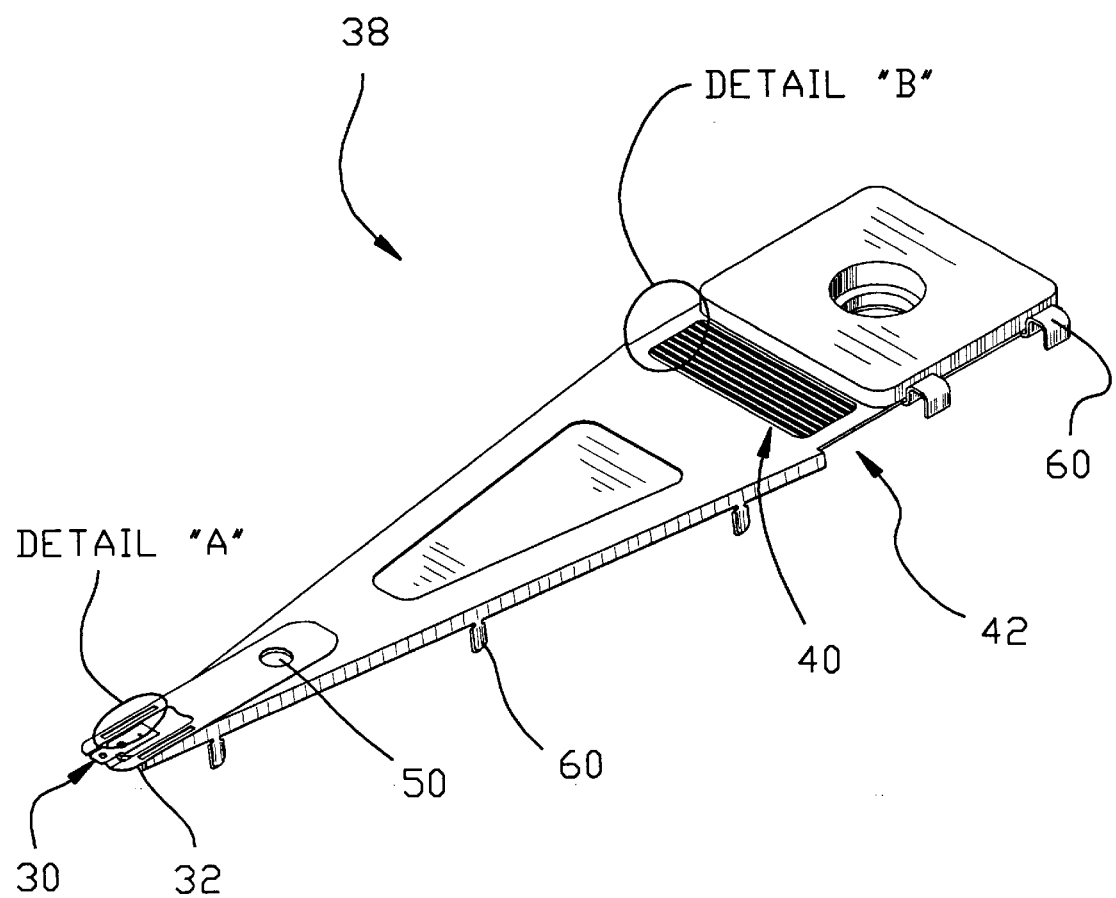
FIG. 2 illustrates a head suspension assembly (HSA) having areas of differing etched thicknesses.

As shown in FIG. 2, the suspension 38 has a partial etch region 40 located in the spring area 42. In fabricating HSAs generally and particularly for HSAs having separate flexure and load beam areas, it is necessary to fabricate thru-features, such as the locating and aligning apertures 50, while still providing a desired partial thickness etched area 40 in the spring area 42. Controlled diffusion partial etching according to the present invention allows for optimal partial thickness etching coincident with the forming of thru-features, achieving desired dimensions and tolerances in both areas while using a single step partial etch process.

Figure 3A:
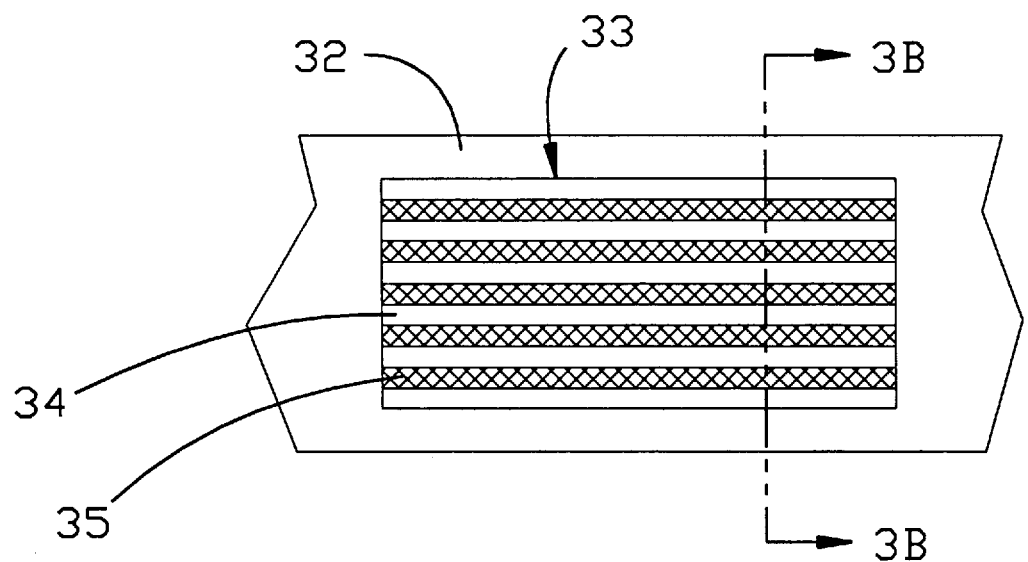
FIG. 3A is an enlargement of detail "A" from flexure area of the suspension of FIG. 2.
Figure 3B:
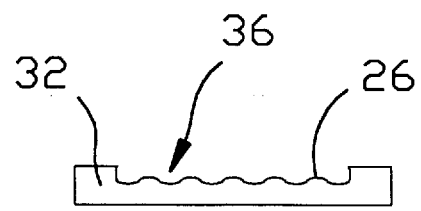
FIG. 3B is an sectional view of the detail shown in detail "B" from FIG. 3A.

As shown in the suspension illustrated in FIG. 2 and the enlarged detail thereof shown in FIGS. 3A and 3B, the gimballing flexure portion 30 has areas of variable thickness on the flexure arm or strut 32. The rectangular area 33 characterized by the pattern of replicated lines 35 has a reduced thickness. FIG. 3A illustrates the positioning and dimensioning of the resist openings 34 and land features 35 which are instrumental in forming the rectangular area 33 of reduced thickness.

Using the process according to the present invention, multiple varying thickness areas on the flexure 30 can be fabricated in a single step etching procedure, without the cost, time and effort of carrying out additional separate expose and/or etch operations.

According to a preferred embodiment, the partially etched area 33 of the flexure shown in FIGS. 2 and 3A is fabricated by use of a corresponding mask area having 25.4 micrometer spaces 34 on 63.5 micrometer centers, traversing the length of the partially etched portion of flexure arm 32. Use of a different pattern of line widths and spacings on other areas will produce a different effective etch rate and a different resulting thickness partial etch area for the same etching time.

Figure 4A:
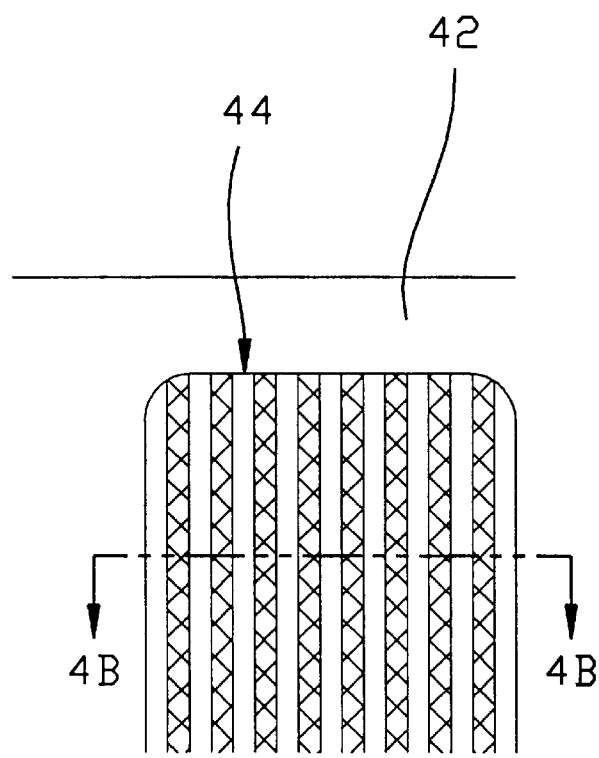
FIG. 4A is an enlargement of detail "B" from the spring area of the suspension of FIG. 2.
Figure 4B:
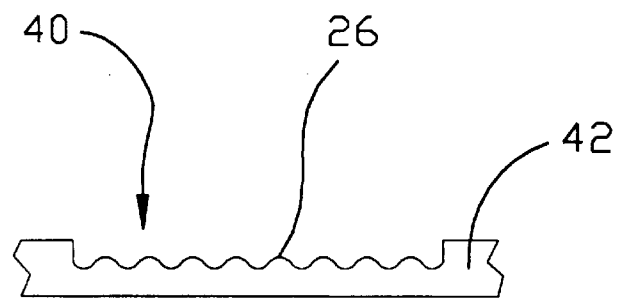
FIG. 4B is sectional view of the detail shown in FIG. 4A taken along section lines 4B.

As has been mentioned above, the controlled diffusion partial etch technique of the present invention is also used in fabricating the partial etch area 40 in the spring region 42 of the HSA 38 shown in FIGS. 2, 4A, and 4B. Using previously available etching processes, a major problem in fabricating such suspensions 38 was that, in order to achieve a desired nominal remaining effective thickness of 30.5 micrometers in the partial etch area 40, a less than optimal compensation on the thru-features had to be accepted. Compensation was necessary on features that were etched completely through the sheet to allow for the fact that as the etch penetrated the surface, the etching rate around the circumference of the aperture causes the hole diameter to rapidly increase. Consequently, thru-feature tolerance on a 813 micrometer tooling hole increased from a desired ±89 micrometers to ±127 micrometers.

Using the controlled diffusion partial etch process of this invention, controlled etching of partial etch portions can be combined with optimal thru-feature compensation so that the accuracy of the dimensions of the thru-features is more satisfactorily attained. The improvement in compensation corresponds to a nominal remaining thickness increase of approximately 10.2 micrometers for the partial etch method of the present invention based on a 1.8 etch factor when compared to less than optimal compensation presently employed using conventional partial etching techniques.

In addition to introducing areas of partial etching in the spring area of the suspension and in the flexure arms, it is also possible in accordance with the present invention to etch the load protruberance in the flexure by removing material around the protruberance to leave a remaining protruberance. In developing a process for fabricating such a HSA by etching, several manufacturing options were considered which would include rounding off the sharp edges of the protruberance (that is, the interface between full thickness and partial thickness areas). Several conventional process options which could be considered to accomplish this include:

1) static etching, or frosting, to form the protuberance by applying a resist, developing away the resist and dipping the sheet in a static tank of ferric chloride.

2) round-off or fast pass etching of the dimple, by applying and developing the resist and performing a spray etch process.

3) electropolishing by applying and developing a resist layer and then using an electropolishing rather than a spray etching step to remove material.

The first three options were achieved through a double exposure process, similar to the process described above, which has been used previously in the manufacture of print bands in U.S. Pat. Nos. 4,235,664 and 4,251,318 referred to above.

Figure 5A:
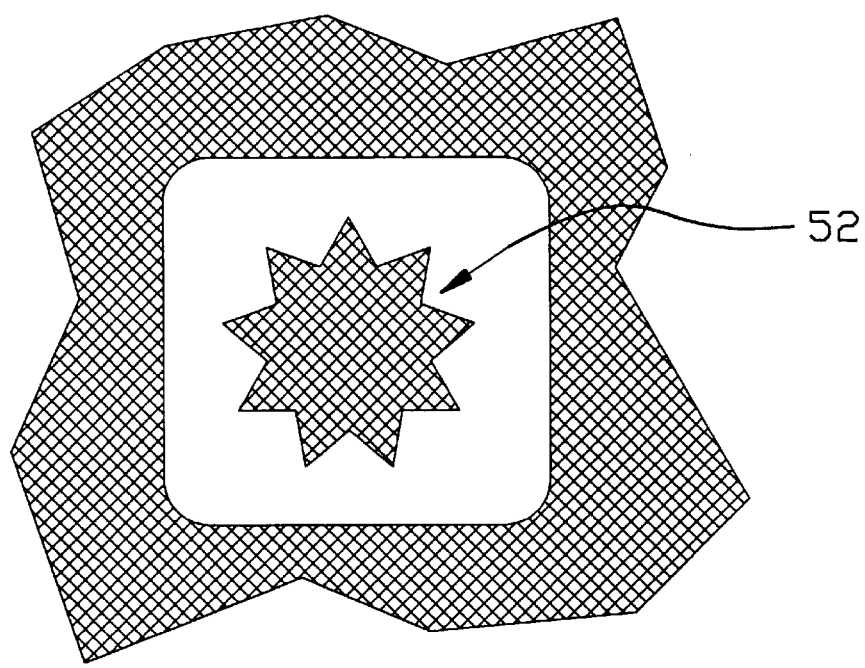
FIG. 5A illustrates a "sunburst" pattern for a resist for forming a dimple on an HSA flexure.
Figure 5B:
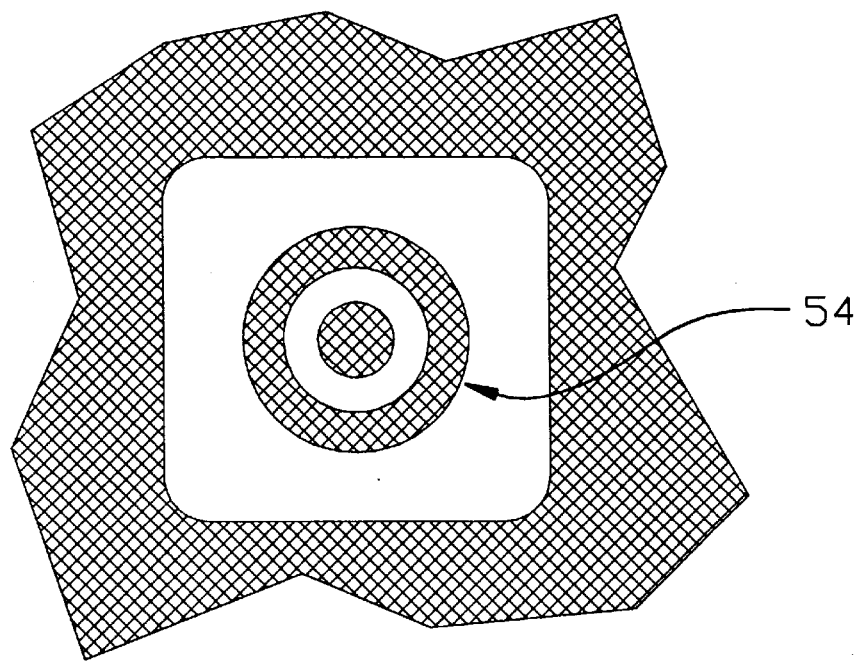
FIG. 5B illustrates a "saturn" pattern for a resist for forming a dimple on an HSA flexure.

In accordance with the present invention a process for forming the load protruberance can be designed using the alternation of narrow land areas and areas between lands to provide a mask geometry in which the resist would fall off (i.e. separate from the workpiece) near the edge of the dimple as the etching progresses. See, for example, the "sunburst" load protruberance feature 52 of FIG. 5A. Consider also the "saturn" load protruberance feature 54 of FIG. 5B. The hatched areas in the figures represent the masked or land areas while the open areas represent the unmasked areas between the land areas of the resist patterns illustrated in FIGS. 5A and 5B.

The "saturn" and "sunburst" pattern concepts are examples of controlled diffusion partial etching techniques developed according to the present invention which can be carried out at the same time that the critical etch area etching steps or conventional partial etching steps are carried out in the course of a single etching step. In the "sunburst" 52 and "saturn" 54 resist patterns which may be used to produce a raised feature for use as a load protruberance, the mask at the perimeter of the protruberance falls away in the course of the single stage etch process to form a smoother transition from the central portion of the protruberance to the fully etched region surrounding the protruberance.

Moreover, another added benefit of the present novel etching process is a reduction in nominal thickness variability within the partial etch area in the load beam spring region. Using previous etching procedures, the partial etch area was fabricated with an undesirable "bread loaf" profile; see Table 1 and the corresponding points of measurement in FIG. 6. Using the controlled diffusion partial etch procedures, this profile is minimized; see Table 2.

TABLE 1

Figure 6:
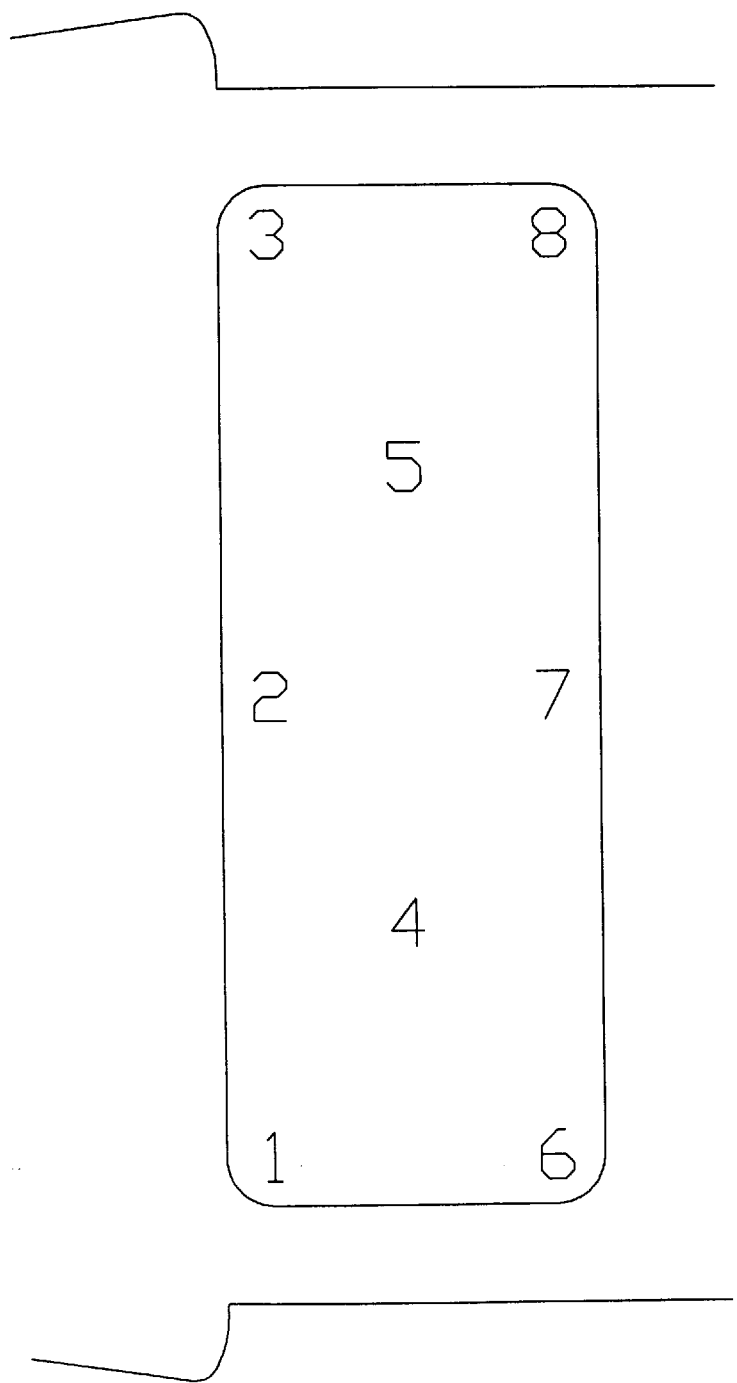
FIG. 6 illustrates various points selected for thickness measurements of an etched reduced thickness area in an HSA spring region.

Average thickness (in.) at measurement zones as shown in FIG. 6 without diffusion controlled partial etching

| Measurement Zone | Thickness (in.) |
| --- | --- |
| 1 | .001290 |
| 2 | .001370 |
| 3 | .001340 |
| 4 | .001470 |
| 5 | .001470 |
| 6 | .001240 |
| 7 | .001350 |
| 8 | .001300 |

D = MAX-MIN = .000230

TABLE 2

Average thickness (in.) by measurement zones as shown in FIG. 6 with diffusion controlled partial etching

| Measurement Zone | Thickness (in.) |
| --- | --- |
| 1 | .001092 |
| 2 | .001158 |
| 3 | .001131 |
| 4 | .001137 |
| 5 | .001129 |
| 6 | .001064 |
| 7 | .001186 |
| 8 | .001114 |

D = MAX-MIN = .000122

Other applications of the present novel controlled diffusion partial etch procedure include the following.

1. Suspensions fabricated with a partial etch regions on the flexure arms exhibit reduced pitch and roll spring rates with minimal lateral stiffness changes and without negatively impacting the suspension resonance characteristics.
2. Suspensions etched in accordance with the present invention achieve varying spring rates without the necessity of carrying out of additional process steps merely by controlling of the controlled diffusion partial etch critical etch factor parameters, namely the widths of the mask land features and the widths of the spacing between land features comprising critical etch spacing.
3. Using the partial etch processes of the present invention it is possible to vary the gimbal arm to head clearances thereby providing more clearance for higher loads without the necessity of carrying out additional process steps.
4. Wire captures fabricated by the present process evidence a smoother, less abrasive exterior to minimize the occurrence of nicks or shorts on exposed wires and conductive elements (such as optical fibers, etc.)

Additional benefits from the use of the present controlled diffusion partial etching process include lower processing costs, compared to prior procedures requiring several separate exposing and etching steps, and result in less dimensional variability in the fabrication of thru-features. By using the present novel process, two, three or more partially etched reduced thickness zones can be fabricated in a single substrate in a single procedure, with a more uniform thickness to the reduced thickness zone than could be obtained with previous procedures, and with less variability of nominal thickness on replicated workpieces.

What is claimed is:

1. A single step expose/etch partial etching process for producing at least two areas of different thicknesses on a substrate, said process comprising the steps of:

applying a resist mask to selected portions of the substrate;

patterning a first mask area of a first predetermined planar size and planar shape to form a plurality of first mask openings and first mask land features, dimensioned to provide a first area etch factor;

patterning a second mask area of a second predetermined planar size and planar shape to form a plurality of second mask openings and second mask land features wherein the width of the second mask land features and the spacing between the second mask land features are selected to provide at least one opening characterized by a critical etch spacing, such that the second area has a second area etch factor, wherein the second area etch factor is reduced relative to the first area etch factor; and etching the substrate through the first and second mask areas so that the substrate corresponding to the second mask area is etched to a lesser depth than the substrate corresponding to the first mask area.

2. A process according to claim 1, wherein the first mask land features are dimensioned such that, as etching proceeds, a thru-feature is formed.

3. A process according to claim 1, wherein the first mask land features are replicate parallel lines or pedestals.

4. A process according to claim 1, further comprising the step of removing all remaining portions of the resist mask in the first and second areas of the substrate after completion of the single etching step.

5. A process according to claim 1, wherein the etching is photoetching.

6. A single step partial etching process for etching a substrate to produce at least two areas having substantially different post-etching depths, said process comprising the steps of:

applying a resist mask to selected portions of the substrate;

patterning a first mask area over a first portion of said substrate to provide an etch pattern establishing a critical etch space for etching said first area to a first average depth where said first mask area is of predetermined planar size and shape and said mask is comprised of a plurality of alternating first mask land features each of which has a maximum width which is less than the first average depth and a plurality of first mask openings interposed between such first mask land features, said first average depth being determined for a predetermined etching time by the width of the first mask land features and the width of the first mask openings which are selected to have dimensions so that the first mask area is a critical etch space wherein the width of the exposed substrate between mask edges is selected so that the etch factor is reduced over the etch factor otherwise applicable to the substrate;

patterning a second mask area on a second portion of said substrate, where said second mask area has at least one opening of predetermined size and shape; and isotropically etching the entire substrate for a predetermined time wherein the critical etch space of said first mask area is etched to a lesser depth than the depth of the second mask area due to the reduced etch factor of the first mask area.

7. A process according to claim 6, wherein the first mask land features are dimensioned such that, as etching proceeds, a thru-feature is formed.

8. A process according to claim 6, wherein the first mask land features are replicate parallel lines or pedestals.

9. A process according to claim 6, wherein adjacent mask openings and mask land features in the first area replicate each other, respectively.

10. A process according to claim 6, further comprising removing the resist mask.

11. A process according to claim 6, for fabricating at least three areas of differing remaining thicknesses in a substrate, said process further comprising:

patterning in said mask a third area having at least one third mask opening of predetermined size and shape, such that a distance between edges of the third mask opening is greater than a critical etch space.

12. A single stage expose/etch partial etching process for fabricating at least two areas of differing remaining thicknesses in a substrate having an original thickness, said process comprising:

applying a resist mask to the substrate;

patterning in said mask a first area of a first predetermined planar size and planar shape having at least one opening, dimensioned to provide a first area etch factor;

patterning in said mask a second area of a second predetermined planar size and planar shape to form a plurality of second mask openings and second mask land features, wherein the width of the second mask land features and the width of the spacings between the second mask land features are selected to provide at least one opening characterized by a critical etch spacing such that the second area has a second area etch factor and wherein the second area etch factor is reduced relative to the first area etch factor; and etching the substrate for a predetermined time through the first and second mask areas, thereby etching the substrate corresponding to the second mask area to a lesser depth than substrate corresponding to the first mask area.

13. A process according to claim 12, wherein the first mask land features are dimensioned such that, as etching proceeds, a thru-feature is formed.

14. A process according to claim 12, wherein the mask openings in the first area are replicate parallel lines or pedestals.

15. A process according to claim 12, wherein the mask openings and mask land features in the first area are replicates of each other, respectively.

16. A process according to claim 12, further comprising removing the resist mask.

17. A process according to claim 12, wherein the etching is photoetching.

18. A process according to claim 12, wherein the substrate is a component of a head suspension assembly.

19. A process according to claim 1, wherein the second mask land features are dimensioned such that, as etching proceeds, at least one undercut region is formed, said undercut region resulting in the separation of the second mask land features from the substrate.

20. A process according to claim 12, wherein the second mask land features are dimensioned such that, as etching proceeds, at least one undercut region is formed, said undercut region resulting in the separation of the second mask land features from the substrate.

21. A process according to claim 1, wherein the step of applying comprises applying a single-layer resist mask to selected portions of the substrate.

22. A process according to claim 6, wherein the step of applying comprises applying a single-layer resist mask to selected portions of the substrate.

23. A process according to claim 12, wherein the step of applying comprises applying a single-layer resist mask to the substrate.

* * * * *